United States Patent [19]

Grange et al.

[11] Patent Number: 5,388,998
[45] Date of Patent: Feb. 14, 1995

[54] METHOD AND SYSTEM FOR PRODUCING ELECTRICALLY INTERCONNECTED CIRCUITS

[75] Inventors: Jeffrey J. Grange, Brush Prairie, Wash.; J. P. Harmon, Corvallis, Oreg.

[73] Assignee: Hewlett-Packard Company, Palo Alto, Calif.

[21] Appl. No.: 245,713

[22] Filed: May 17, 1994

Related U.S. Application Data

[63] Continuation of Ser. No. 33,692, Mar. 16, 1993, abandoned.

[51] Int. Cl.$^6$ .............................................. H01R 9/09
[52] U.S. Cl. ......................................... 439/66; 439/908
[58] Field of Search ............... 439/66, 262, 263, 245, 439/247, 248, 591, 840, 841, 908

[56] References Cited

U.S. PATENT DOCUMENTS

| | | | |
|---|---|---|---|
| 4,029,375 | 6/1977 | Gabrielian | 430/66 |
| 4,528,500 | 7/1985 | Lightbody et al. | 439/66 |
| 4,577,200 | 3/1986 | Rix et al. | 346/140 R |
| 4,706,097 | 11/1987 | Harmom | 346/139 C |
| 4,707,657 | 11/1987 | Boegh-Petersen | 324/158 |
| 4,755,836 | 7/1988 | Ta et al. | 346/140 R |
| 4,849,772 | 7/1989 | Ten Broeck et al. | 346/139 R |
| 4,862,197 | 8/1989 | Stoffel | 346/140 R |
| 4,872,026 | 10/1989 | Rasmussen et al. | 346/140 R |
| 4,881,901 | 11/1989 | Mendenhall et al. | 439/65 |
| 4,988,306 | 1/1991 | Hopfer, III et al. | 439/66 |
| 5,174,763 | 12/1992 | Wilson | 439/66 |

FOREIGN PATENT DOCUMENTS

| | | |
|---|---|---|
| 0240710 | 10/1987 | European Pat. Off. . |
| 3115787 | 11/1982 | Germany . |
| 2189657 | 10/1987 | United Kingdom . |
| WOA9014750 | 11/1990 | WIPO . |
| WOA9208258 | 5/1992 | WIPO . |

OTHER PUBLICATIONS

Roy T. Buck, Printhead Interconnect, May 1985, Hewlett-Packard Journal (p. 14).

*Primary Examiner*—Khiem Nguyen

[57] ABSTRACT

A system is provided for effectively and efficiently interconnecting a first rigid circuit with a second rigid circuit. The interconnected circuit system includes, in addition to the first and second circuits, a compressive conductive member. The compressive conductive member has a first end for interconnecting engagement with the first circuit and a second end for interconnecting engagement with the second circuit. The first end of the compressive conductive member is connected with the first circuit and the second end of the compressive conductive member with the second circuit thereby connecting the first circuit to the second circuit to form a completed electrical circuit.

14 Claims, 2 Drawing Sheets

METHOD AND SYSTEM FOR PRODUCING ELECTRICALLY INTERCONNECTED CIRCUITS

CROSS REFERENCE TO RELATED APPLICATION(S)

This is a continuation of application Ser. No. 08/033,692, filed on Mar. 16, 1993, now abandoned.

BACKGROUND OF THE INVENTION

This invention relates generally to methods and systems for producing electrically interconnected circuits, and more particularly to electrically interconnected circuits which are especially adapted for making external electrical connections to thermal ink jet printheads.

It is known to provide heater resistors on a common substrate, such as silicon, and employ these resistors to transfer thermal energy to corresponding adjacent ink reservoirs during a thermal ink jet printing operation in the manufacture of thin film resistors substrates for thermal ink jet printheads. This thermal energy will cause the ink in the reservoirs to be heated to boiling and thereby be ejected through an orifice in an adjacent nozzle plate from which it is directed onto a print medium. These heater resistors are electrically pulsed during such operation by current applied thereto via conductive traces formed on top of the silicon substrates and insulated therefrom by an intermediate dielectric layer. The formation of an intermediate dielectric layer, the formation of the resistive layer for the heater resistors, and the aluminum evaporation of sputtering process for forming electrical patterns of conductive trace material to the heater resistors are all well known in the art and therefore are not described in further detail herein. The processes used in the fabrication of thermal ink jet printheads are discussed in the Hewlett Packard Journal, Volume 36, Number 5, May 1985 ("HP Journal Article"), which is incorporated herein by reference. Hewlett Packard Corporation is the assignee of the entire right, title and interest in the subject patent application.

Electrical connections are provided between external pulse drive circuits and the conductive traces on the thermal ink jet printhead using flexible or "flex" circuits to make removable pressure contacts to certain conductive terminal pads on thin film resistor printhead substrates or to tape automated bonding (TAB) circuits. These electrical connections are facilitated by applying pressure to the flexible circuit so that the electrical leads therein make good electrical connection with corresponding mating pads on the thin film resistor printhead substrate. These flexible circuit generally comprise photolithographically defined conductive patterns formed by various etching processes carried out on a thin flexible insulating substrate member. The electrical contact locations on the flex circuit will be raised slightly in a bump and dimple configuration. This configuration is formed using a punch structure which matches the location of the correspondingly dimples. The punch structure is used to form the electrical contact locations on the flex circuit at raised locations above the surface of the insulating substrate member. During this punch process, it sometimes happens that not all of the raised contact bumps in the flexible circuit are moved the same distance above the insulating substrate surface thereby producing a nonuniform dimple configuration. For this reason, more force is necessary to make contact with the smaller, or lower height bumps than those higher bumps more extended from the surface of the flex circuit. When a significant force is exerted against the flex circuit by the printhead in order to interconnect same, crushing of a portion of the raised dimple structure will result. Furthermore, the presence of a nonuniform dimple configuration will prevent contact of the printhead and flexible circuit at their interface.

Other problems result from the use of a dimpled configuration per se. The raised dimple structure formation process is expensive to fabricate and requires high contact forces in its implementation. Moreover, there is poor control over the point geometry of that formation process. Spacing of the dimples in the overall dimple configuration is also a problem because they need to be spaced a relatively close intervals. However, spacing is limited by the thickness and fragility of the metal employed to form the dimpled structure. The close spaced dimpled structure, which is unique to ink jet printing, is quite difficult to manufacture.

Contact between the flex circuit and conductive pads on the TAB circuit can be maintained by using an elastomeric material, such as rubber, which has been preformed to have a plurality of cones spaced at locations corresponding to the location of the dimples in the flex circuit. The tips of these elastomeric cones can be inserted into the dimples of the flex circuit and urged thereagainst with a force sufficient to bring the conductive bumps on the flex circuit in to good physical and electrical contact with the terminal pads on the TAB circuit.

A contact array (see FIG. 1 of the HP Journal Article) can be integrated with a flexible printed circuit that carries the electrical drive pulses to the printhead. Connector mating is achieved by aligning the printhead cartridge registration pins with the mating holes in the carriage/interconnect assembly and then rotating a cam latch upward or pivoting the printhead into position. In this way, electrical contact can be made without lateral motion between the contact halves. The contact areas are backed with silicon-rubber pressure pads (see FIG. 2 of the HP Journal Article) which allow electrical contact to be maintained over a range of conditions and manufacturing tolerances. Electrical contact is enhanced by dimpling the flexible circuit pads. The dimples are formed on the flexible circuit before the plating is applied.

While the above prior art approach to making electrical contact between the flex circuit and the print-head substrate has proven satisfactory for certain types of interconnect patterns with few interconnect members, it has not been entirely satisfactory for low voltage signal contacts. This fact has been a result of the nature of the nonlinear deflection of the above elastomeric cones. This nonlinear deflection of the elastomeric cones is seen as a nonlinear variation of cone volumetric compression, "V", as a function of the distance, "D", that the tip of the cone is moved during an interconnect operation. Thus, this nonlinear characteristic tends to increase the amount of force which must be applied to the flex circuit in order to insure that all the bumps on the flex circuit make good electrical contact with the conductive traces of terminal pads on the printhead substrate. In some cases this required force is sufficiently large to fracture the substrate or do other structural damage thereto. This non-linear deflection characteristic of the prior art is described in more detail below with reference to the prior art FIGS. 1A and 1B of U.S.

Pat. No. 4,706,097, which is incorporated herein by reference.

In order to reduce the amount of force required to insure good electrical contact between a flex circuit and a TAB circuit for a thermal ink jet printhead, a novel, nearly-linear spring connect structure for placing the flex circuit into good electrical contact with contact pads on the printhead substrate with a minimum of force applied thereto was developed. This structure is set forth in the U.S. Pat. No. 4,706,097 patent. This spring connect structure includes a central locating member having a plurality of cylinders extending integrally therethrough and therefrom to a predetermined distance from each major surface of the central locating member. Cone-shaped tips located at upper ends of the elastomeric deflectable cylinders are inserted into dimples of the flexible circuit with a force sufficient to bring the electrical bumps or pads above the dimples into good electrical contact with mating conductive contact pads on the printhead substrate. The volumetric deformation of the elastomeric deflectable cylinders varies substantially linearly as a function of the force applied to the lower ends of these cylinders. This feature enables the vertical displacement of the cylinder walls to be maximized for a given force applied to these cylinder.

The above-described rubber parts present a problem to the user. More specifically, in order to function in the manner described above, the rubber components must be manufactured to a high Level of precision. However, precision rubber components are difficult at best to manufacture.

SUMMARY OF THE INVENTION

The subject invention overcomes the problems associated with the prior art interconnected devices by providing a system which is capable of effectively and efficiently interconnecting a first rigid circuit, with a second rigid circuit, both of the circuits typically being in the form of a rigid circuit board or stiffened flex circuit. The system of the present invention can be employed in conjunction with circuits with or without a raised dimple configuration, even a nonuniform raised dimple configuration. In spite of this, a good contact of the first and second circuits at their interface can be maintained. Therefore, when a significant force is exerted against the first circuit by the second circuit for purposes of interconnectingly engaging the system of this invention, crushing of the raised dimple structure will not result. In fact, the flex circuit no longer requires the dimples described in U.S. Pat. No. 4,706,097 in order to form a completed electrical circuit. In this way, a good electrical contact will exist between the respective circuits.

The interconnected circuit system includes, in addition to the first and second circuits, a compressive conductive member. The first and second circuit has means for interconnecting engagement with the compressive conductive member. The compressive conductive member has a first end for interconnecting engagement with the first circuit and a second end for interconnecting engagement with the second circuit. In this way, when the first end of the compressive conductive member is connected with the first circuit and the second end of the compressive conductive member is connected with the second circuit, the first circuit and the second circuit together with the compressive conductive member form a completed electrical circuit. The second circuit typically comprises a TAB circuit or a printhead substrate or a stiffened flex circuit. Preferably, the compressive conductive member comprises a conductive spring member, more preferably a conductive coil spring interconnect member.

The system of the present invention can further include a carrier member including means for receiving and maintaining the compressive conductive member in interconnecting engagement with the first and second circuits. The compressive conductive member is introduced into the carrier member and interconnectingly engages the first and second circuit. The compressive conductive member can be fabricated of either one of a metallic material and a conductive polymer.

The compressive conductive member typically comprises a coil spring interconnect member, the coil spring interconnect member preferably comprising an elongated coil spring body section having first and second ends and coil spring end sections attached to said first and second end sections. The coil spring interconnect member preferably comprises an elongated coil spring body having first and second ends, and at least one end section joined to at least one of said first and second end sections. The end section preferably comprise coil spring end sections attached to either one of said first and second end sections. In a preferred form of this invention, the rigid end tip sections are attached to either one of said first and second end sections. The lateral dimension of the elongated coil spring body section is preferably greater than the lateral dimension either one of the first and second ends.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
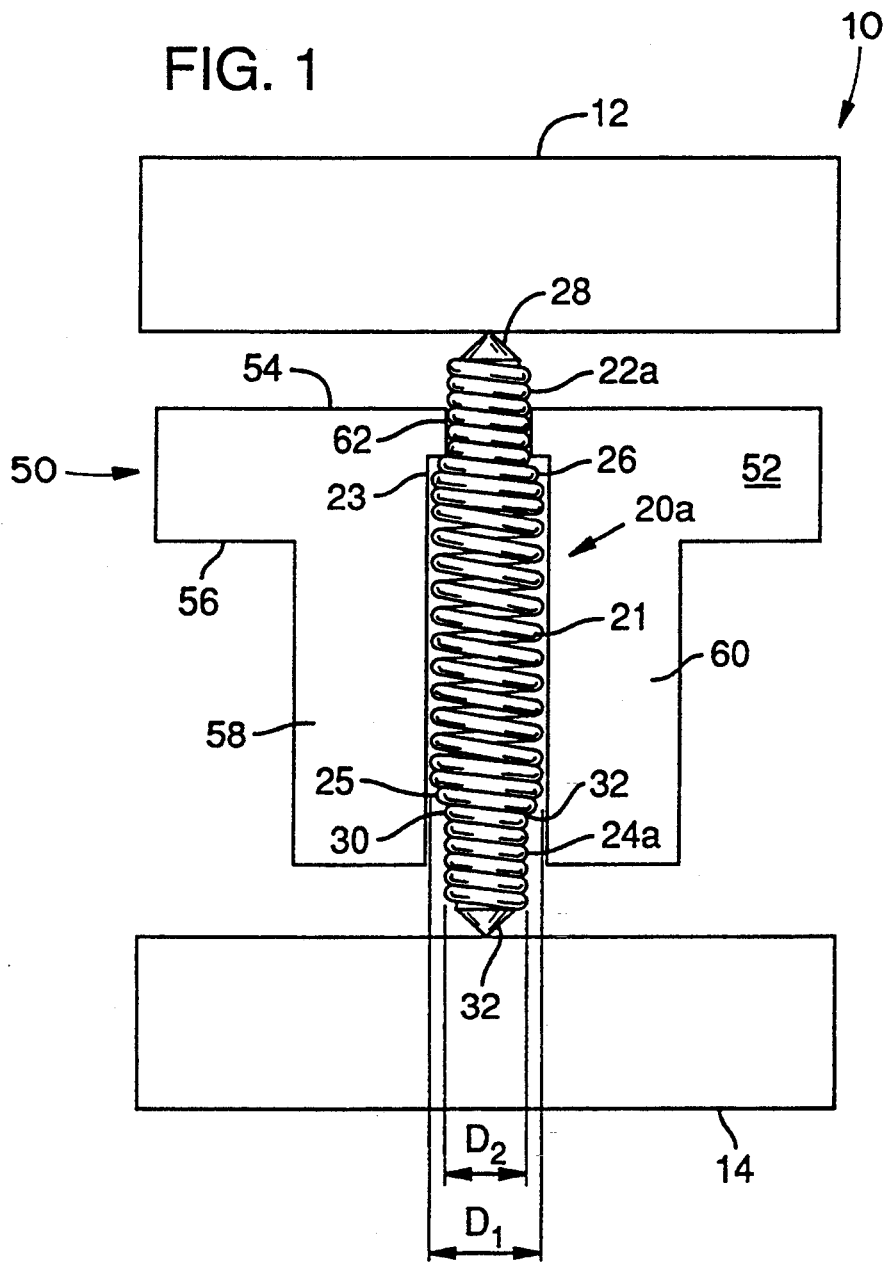
FIG. 1 is a schematic representation of an interconnected circuit system including a compressive conductive member of the present invention having coil spring end sections.
Figure 2:
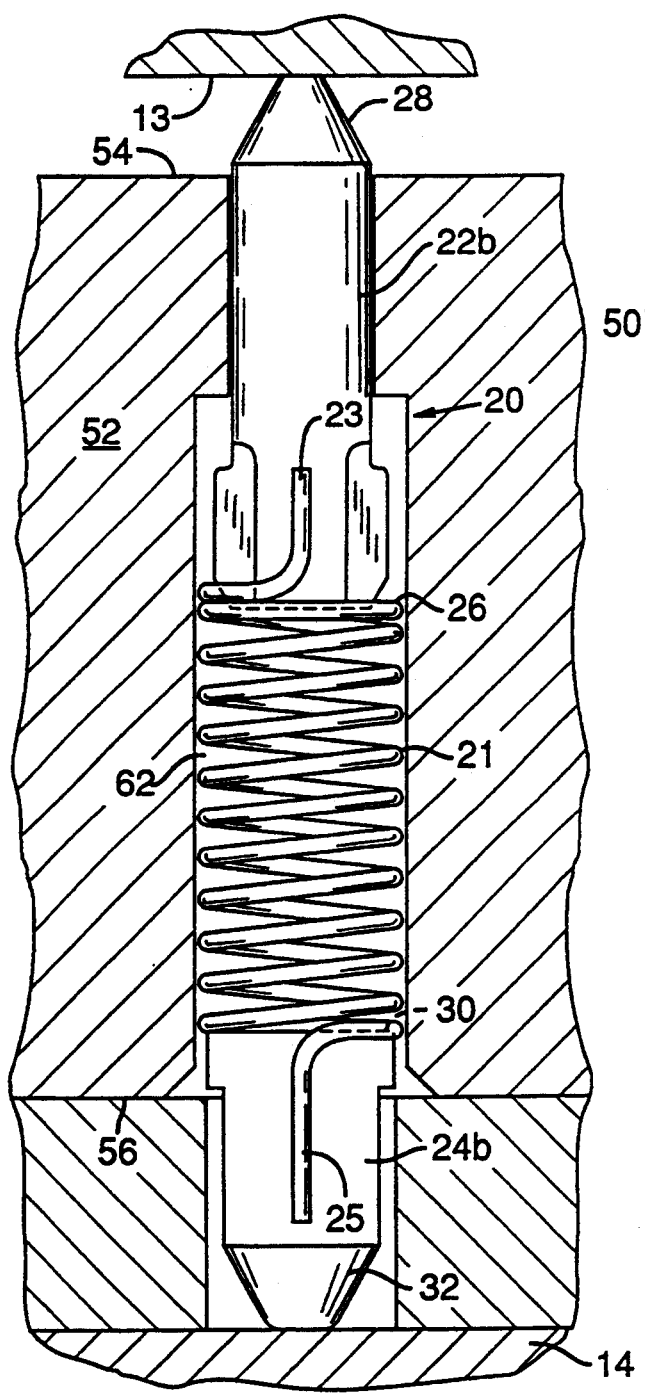
FIG. 2 is a schematic representation of an interconnected circuit system including a compressive conductive member of the present invention having rigid end tip sections.
Figure 3:
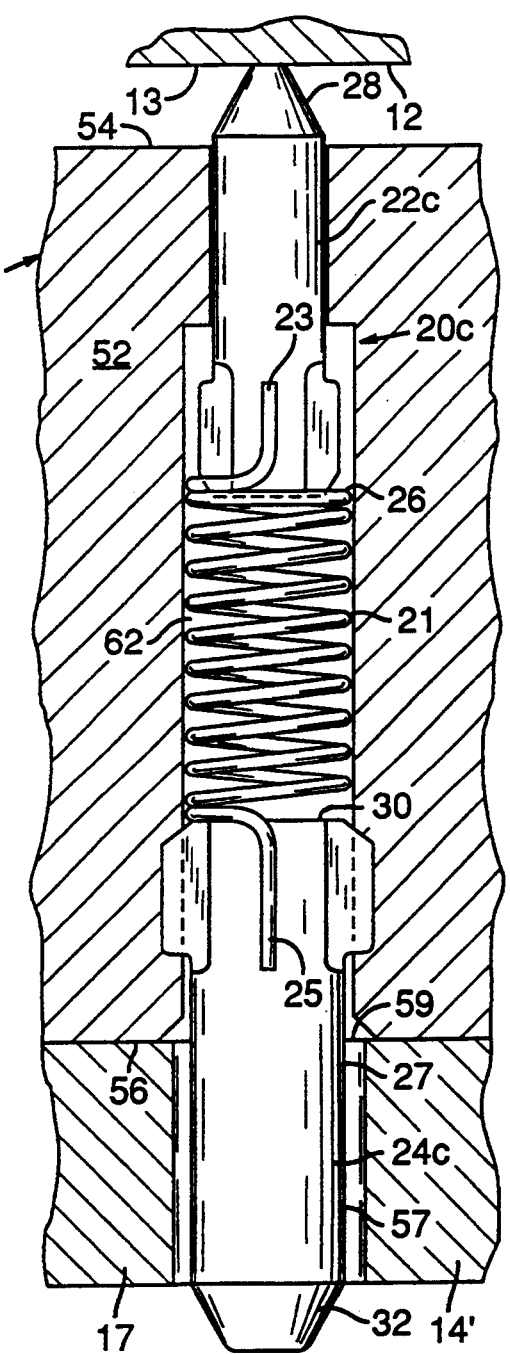
FIG. 3 is a schematic representation of an interconnected circuit system similar in construction to FIG. 2 which extends through, and is connected within, one of the rigid circuit boards.

Referring now to FIG. 1–3, an interconnected circuit-to-circuit system 10 is schematically shown. The system 10 includes a thin film resistor rigid printhead substrate or a TAB circuit 12, such as the Hewlett Packard Deskjet ® printhead, which has been fabricated using state-of-the art semiconductor processing technique. More specifically, circuit 12 can also comprise a rigid circuit such as conventional printed circuit board with plated conductive metal pads, or a stiffened flexible circuit, such as conventional flex circuit laminated to a stiffened member or to a rigid member such as a PC board or to a rigid flat sheet of metal or plastic. It is desired to connect the printhead substrate or TAB circuit 12 to a circuit 14 which can also comprise a rigid circuit or a stiffened flexible or "flex" circuit member as previously described herein.

The circuits 12 and 14 are interconnected via a compressive conductive member to form a continuous electrical pathway. All of the compressive conductive members 20a–20c of FIGS. 1–3 comprise a generally cylindrically-shaped conductive spring member. For example, compressive conductive members 20a includes an elongated cylindrical coil spring body section 21 joined to first and second cylindrical end sections 22a and 24a. Elongated coil spring body 21 has first and second ends 23 and 25. The first end section 22 has an inner end 26 and an outer end 28, and the second end section 24 has an inner end 30 and an outer end 32. Thus, the first end 23 of coil spring body 21 is joined to outer end 28 of first end section 22 and the second end 25 of coil spring body 21 is joined to outer end 32 of second end section 24. Preferably, the lateral dimension of elongated coil spring body section 21, the cross-sectional diameter "D1", is greater than the lateral dimension of said first and second ends 22 and 24, the cross-sectional diameter "D2".

More particularly, as specifically depicted in FIG. 1, compressive conductive member 20a comprises a conductive coil spring having coil spring first and second end sections 22a and 24a. Compressive conductive member 20a can fabricated of a conductive metal such as music wire, or beryllium-copper, or stainless steel plated with gold or palladium metal. Compressive conductive member 20a can also be fabricated of a conductive polymeric material such as a metal-loaded or carbon-loaded elastomeric material.

The compressive conductive members 20b and 20c of FIGS. 2 and 3 also comprise a generally cylindrically-shaped conductive spring member including an elongated cylindrical coil spring body section 21 joined to first and second cylindrical end sections 22b–22c and 24b 24c. These end sections comprise rigid tip sections permanently joined to first and second ends 23 and 25 of elongate coil spring body 21, typically by known welding techniques. As provided above, the first end sections 22b–22c have an inner end 26 and an outer end 28, and the second end section 24b–24c has an inner end 30 and an outer end 32. Thus, the first end 23 of coil spring body 21 is joined to outer end 28 of first end section 22' and the second end 25 of coil spring body 21 is joined to outer end 32 of second end section 24b–24c.

As shown in FIG. 2, the outer end 28 of first end section 22b is designed to interlockingly engage the inner surface 13 of circuit 12 by compressive interconnection therewith. In a similar manner, outer end 32 of second end section 24b also interlockingly engages inner surface 15 of circuit 14. In this way, conductive compressive member 20 and circuits 12 and 14 are in intimate contact with each other thereby maintaining the requisite electrical circuit.

According to FIG. 3, the outer surface of outer end 32 of second end section 24c is joined, by standard techniques such as soldering or the like, to circuit 14'. Circuit 14' includes a slot 59 which is sized to receive outer end 32 where it is held in place within slot 59. The outer end 28 extends beyond the outer surface of circuit 14'. The outer end 28 of first end section 22 interlockingly engages inner surface 15 of circuit 12 in a similar manner to the structure of FIG. 2.

The interconnected system 10 is maintained intact with compressive conductive member 20a–c in an interconnectly engaged position so that the longitudinal axis of members 20a–c are substantially perpendicular to circuits 12 and 14, respectively, through the use of a carrier member 50. Carrier member 50 comprises a support base member 52, having outer surfaces 54 and 56. The carrier member 50 also includes a chamber 62 which passes through outer surfaces 54 and 56 and within base 52. Chamber 62 is sized to matingly receive compressive conductive member 20a–c. In use, compressive conductive members 20a–c are in fitting engagement with base 52 within chamber 62. At the same time, compressive conductive members 20a–c are maintained in a substantially vertical position within the space defined by chamber 62 of carrier member 50. The outer ends of first and second end sections 28 and 32 extends outwardly from within chamber walls 58 and 60 which defines a chamber 62 so that they interlockingly engage circuits 12 and 14 as described above.

A prior art near-linear spring contact structure, denoted "58", is depicted in FIGS. 3A and 4 and in column 4, lines 3–59 of previously described U.S. Pat. No. 4,706,097. The compressive conductive member of this invention also comprise a near-linear spring contact structure for the circuits 12 and 14, while acting to interconnect the subject circuit system 10. This means that the circuit system 10 of the present invention has a significantly lower final load $L_1$ requirement. As explained in detail in U.S. Pat. No. 4,706,097, this causes circuit 12 to remain in intimate contact with the circuit 14 during use. This feature provides a design which ensures a high level of electrical contact therebetween. Similarly, circuits 12 and 14 are maintained in continuous electrical contact. This is accomplished through the use of the system 10 of the subject invention in which compressive conductive member 20 is in intimate contact with circuits 12 and 14.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. A method for interconnecting a first circuit to a second circuit, which comprises
   providing a first circuit and a second circuit;
   providing a compressive conductive elongate coil interconnect spring member comprising an elongated coil spring body, the compressive conductive elongate coil interconnect spring member having a first end and a second end joined to a first and second rigid end section; and connecting the first and second rigid end section to the first circuit and the second circuit thereby connecting the first circuit to the second circuit to form a completed electrical circuit, at least one of said first and second end sections are permanently joined to said first circuit or said second circuit by soldering.

2. The method of claim 1, wherein the the first rigid end section is connected to the first circuit and the second rigid end section is connected to the second circuit by compressive interconnection therewith.

3. The method of claim 1, wherein the first and second circuits comprise either one of a rigid circuit board and a stiffened flex circuit.

4. The method of claim 1, which further includes the steps of providing a carrier member including means for receiving and maintaining the compressive conductive member in interconnecting engagement with the first and second circuit; introducing the compressive conductive member into the carrier member; and interconnectingly engaging the compressive conductive member and the first and second circuit.

5. The method of claim 1, which further includes the step of fabricating the compressive conductive member of either one of a metallic material and a conductive polymer.

6. The method of claim 1, wherein at least one of said first and second end sections is permanently joined to said first circuit or said second circuit.

7. The method of claim 1, wherein the first and second rigid end section comprises first and second rigid end tip sections attached to either one of said first and second end sections of said conductive spring member.

8. An interconnected rigid circuit-flexible circuit system, which comprises a first circuit and a second circuit; a compressive conductive elongate coil interconnect spring member comprising an elongated coil spring body, the compressive conductive elongate coil interconnect spring member having a first end and a second end, said first and second end of said conductive spring member being joined to a first and second rigid end section; and the first and second rigid end section conected to the first circuit and the second circuit thereby connecting the first circuit to the second circuit to form a completed electrical circuit, at least one of said first and second end sections are permanently joined to said first circuit or said second circuit by soldering.

9. The system of claim 8, wherein the the first rigid end section is connected to the first circuit and the second rigid end section is connected to the second circuit by compressive interconnection therewith.

10. The system of claim 8, wherein the first and second circuits comprise either one of a rigid circuit board and a stiffened flex circuit.

11. The system of claim 8, which further includes the steps of providing a carrier member including means for receiving and maintaining the compressive conductive member in interconnecting engagement with the first and second circuit; introducing the compressive conductive member into the carrier member; and interconnectingly engaging the compressive conductive member and the first and second circuit.

12. The system of claim 8, which further includes the step of fabricating the compressive conductive member of either one of a metallic material and a conductive polymer.

13. The system of claim 8, wherein at least one of said first and second end sections is permanently joined to said first circuit or said second circuit.

14. The system of claim 8, wherein the first and second rigid end section comprises first and second rigid end tip sections attached to either one of said first and second end sections of said conductive spring member.

* * * * *